(12) United States Patent
Lee et al.

(10) Patent No.: US 7,450,636 B2
(45) Date of Patent: Nov. 11, 2008

(54) ADAPTIVE TRANSMIT EQUALIZER

(75) Inventors: Patrick J. Lee, San Jose, CA (US); William W. Brown, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 883 days.

(21) Appl. No.: 10/235,357

(22) Filed: Sep. 5, 2002

(65) Prior Publication Data
US 2004/0047409 A1    Mar. 11, 2004

(51) Int. Cl.
*H03H 7/30* (2006.01)
(52) U.S. Cl. ...................................... 375/232
(58) Field of Classification Search ................. 375/229, 375/230, 232, 295; 708/322, 323; 370/275, 370/326; 455/307, 296
See application file for complete search history.

(56) References Cited

U.S. PATENT DOCUMENTS

| | | | |
|---|---|---|---|
| 5,671,265 A * | 9/1997 | Andress | 378/98.11 |
| 5,694,943 A * | 12/1997 | Brewer et al. | 600/515 |
| 5,987,061 A * | 11/1999 | Chen | 375/222 |
| 5,999,349 A * | 12/1999 | Choi | 360/46 |
| 6,370,191 B1 | 4/2002 | Mahant-Shetti et al. | |
| 6,377,312 B1 | 4/2002 | Limberg et al. | |
| 6,380,969 B1 | 4/2002 | Limberg | |
| 6,400,761 B1 * | 6/2002 | Smee et al. | 375/232 |
| 6,404,809 B1 | 6/2002 | Zhang | |
| 6,418,164 B1 | 7/2002 | Endres et al. | |
| 6,650,698 B1 * | 11/2003 | Liau et al. | 375/229 |
| 6,794,939 B2 * | 9/2004 | Kim et al. | 330/149 |

FOREIGN PATENT DOCUMENTS

| | | |
|---|---|---|
| EP | 0707401 | 4/1996 |
| EP | 1085668 | 3/2001 |

OTHER PUBLICATIONS

J.A. Nelder and R. Mead article entitled, "A Simplex Method for Function Minimization"; pp. 308-313.
Ravinderan Ramoo, University of Hertfordshire Project Report entitled, "Channel Equalization for Minimum Phase Channel Using Least-Mean Square and Least-Mean-Lower Order (lp NORM) Adaptive Algorithm", Apr. 2001; 99 pgs.

* cited by examiner

*Primary Examiner*—Chieh M. Fan
*Assistant Examiner*—Jaison Joseph

(57) ABSTRACT

An adaptive transmit equalizer for equalizing digital symbols to be transmitted over a communications channel includes a transmit filter having an associated register for storing at least one filter coefficient. A tuning engine generates performance metric values based on digital symbols received through the communications channel. The tuning engine is configured to identify at least one filter coefficient based on the performance metric values using a simplex algorithm. The tuning engine is configured to communicate the at least one updated filter coefficient to the transmit filter for storage in the register.

25 Claims, 6 Drawing Sheets

ADAPTIVE TRANSMIT EQUALIZER

THE FIELD OF THE INVENTION

The present invention generally relates to data communications, and more particularly to equalization techniques in data communications.

BACKGROUND OF THE INVENTION

Digital systems typically transmit data as symbols having discrete levels of amplitude and/or phase. To the extent that a symbol is received at a level that differs from one of the allowed discrete levels, a measure of communication channel error can be detected. Some existing systems use an equalizer in the receiver that is responsive to the detected error to mitigate the signal corruption introduced by the communications channel. An equalizer is typically a filter that has the inverse characteristics of the communication channel. If the transmission characteristics of the communication channel are known or measured, then the equalization filter parameters can be set directly. After adjustment of the equalization filter parameters, the received signal is passed through the equalizer, which compensates for the non-ideal communication channel by introducing compensating "distortions" into the received signal, which tend to cancel the distortions introduced by the communication channel.

Equalization in existing communication systems is usually done in one of three ways. In a first type of system, the transmitter includes a non-adaptive equalizer. In a second type of system, the receiver includes a non-adaptive equalizer. In a third type of system, the receiver includes an adaptive equalizer.

The most commonly used method in high-speed transmission systems is to use a non-adaptive equalizer. Thus, optimizing performance requires manual tuning with detailed a priori knowledge of the channel. Although the non-adaptive equalizer can be set for a generic channel, such an approach often leads to sub-optimal performance, since all channels do not have exactly the same characteristics as the generic channel. In addition, for non-stationary channels in which the channel characteristics vary over time (such as variations due to temperature, humidity, and power supply voltage), a non-adaptive equalizer will result in sub-optimal performance even if the equalizer was initially tuned optimally.

In many situations, such as in broadcasting, each receiver is in a unique location with respect to the transmitter. Accordingly, the characteristics of the communication channel are not known in advance, and may even change with time. In those situations, where the communication channel is not characterized in advance, or changes with time, an adaptive equalizer in the receiver is typically used. Adaptive equalizers have variable parameters that are calculated in the receiver. A problem to be solved in an adaptive equalizer is how to adjust the equalizer filter parameters in order to restore signal quality to an acceptable performance level.

In some adaptive equalization systems, the parameters of the receiver equalization filter are set using a predetermined pilot signal (a training sequence), which is periodically sent from the transmitter to the receiver. The received training sequence is compared with a known training sequence to derive the parameters of the equalization filter. After several iterations of parameter settings derived from successive training sequences, the receiver equalization filter converges to a setting that tends to compensate for the distortion characteristics of the communications channel.

In blind equalization systems, the parameters of the receiver equalizer filter are typically derived from the received signal itself without using a training sequence. In some prior art systems, the equalizer parameters are adjusted using a Least Mean Squares (LMS) algorithm, in which the training symbols are replaced with hard decisions, or best estimates of the original input symbols. A similar algorithm, referred to as a Recursive Least Squares (RLS) algorithm, has also been used for adaptive filter equalization in receivers.

Some other existing systems use another algorithm, called a Constant Modulus Algorithm (CMA), in combination with an LMS algorithm. The CMA algorithm is usually used first to calculate equalizer filter parameters, which are regarded as an initial estimate. Thereafter, the equalizer filter parameters (as calculated by the CMA algorithm) are typically used in an acquisition mode to find the initial equalizer filter parameters to start the LMS algorithm.

Existing adaptive filter algorithms usually involve performing a gradient search based on a mean square error as the performance metric. The CMA algorithm and the LMS algorithm are typically implemented with a gradient descent strategy. However, it can be a complex task to compute derivatives or to compute a gradient, and may even lead to a system of equations that can not be solved. Further, the number of quality or performance metrics that can be used to drive such algorithms is limited due to the need to compute gradients.

SUMMARY OF THE INVENTION

One form of the present invention provides an adaptive transmit equalizer for equalizing digital symbols to be transmitted over a communications channel. The equalizer includes a transmit filter having an associated register for storing at least one filter coefficient. A tuning engine generates performance metric values based on digital symbols received through the communications channel. The tuning engine is configured to identify at least one filter coefficient based on the performance metric values using a simplex algorithm. The tuning engine is configured to communicate the at least one updated filter coefficient to the transmit filter for storage in the register.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
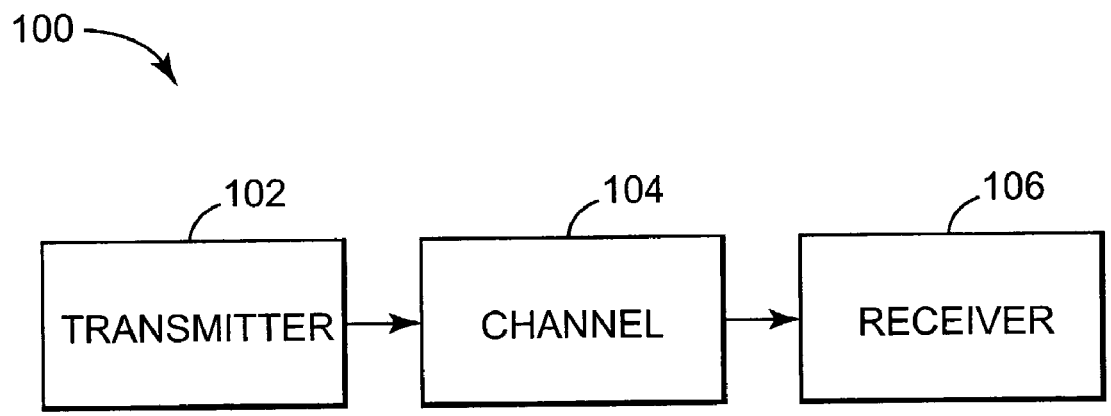
FIG. 1 is block diagram illustrating a prior art communication system.

FIG. 1 is block diagram illustrating a prior art communication system 100. The system 100 includes a transmitter 102 and a receiver 106, which are coupled together via a suitable communication channel 104.

The frequency response of a communication channel, such as channel 104 (or channel 206 shown in FIG. 2), over which a given data communication session is carried out, is not ideal. The channel causes distortion of the signal transmitted by transmitter 102. Such distortion can give rise to effects such as intersymbol interference (ISI), which prevents the receiver 106 from accurately distinguishing adjacent received data symbols from one another. Intersymbol interference occurs when the signal for one bit interferes with the signal for an adjacent bit.

As described above in the Background of the Invention section, an equalizer may be used in communication systems to compensate for distortions caused by the channel. Non-adaptive equalizers have been used in transmitters, and both adaptive and non-adaptive equalizers have been used in receivers of communication systems.

One embodiment of the present invention is described in terms of functional block components and various method steps. It will be understood by persons of ordinary skill in the art that such functional blocks may be realized by any number of hardware components configured to perform the specified functions. For example, embodiments of the present invention may employ various integrated circuit components (e.g., memory elements, digital signal processing elements, look-up tables, and the like), which may carry out a variety of functions under the control of one or more microprocessors or other control devices. In addition, those skilled in the art will appreciate that the present invention may be practiced in any number of data communication contexts.

Figure 2:
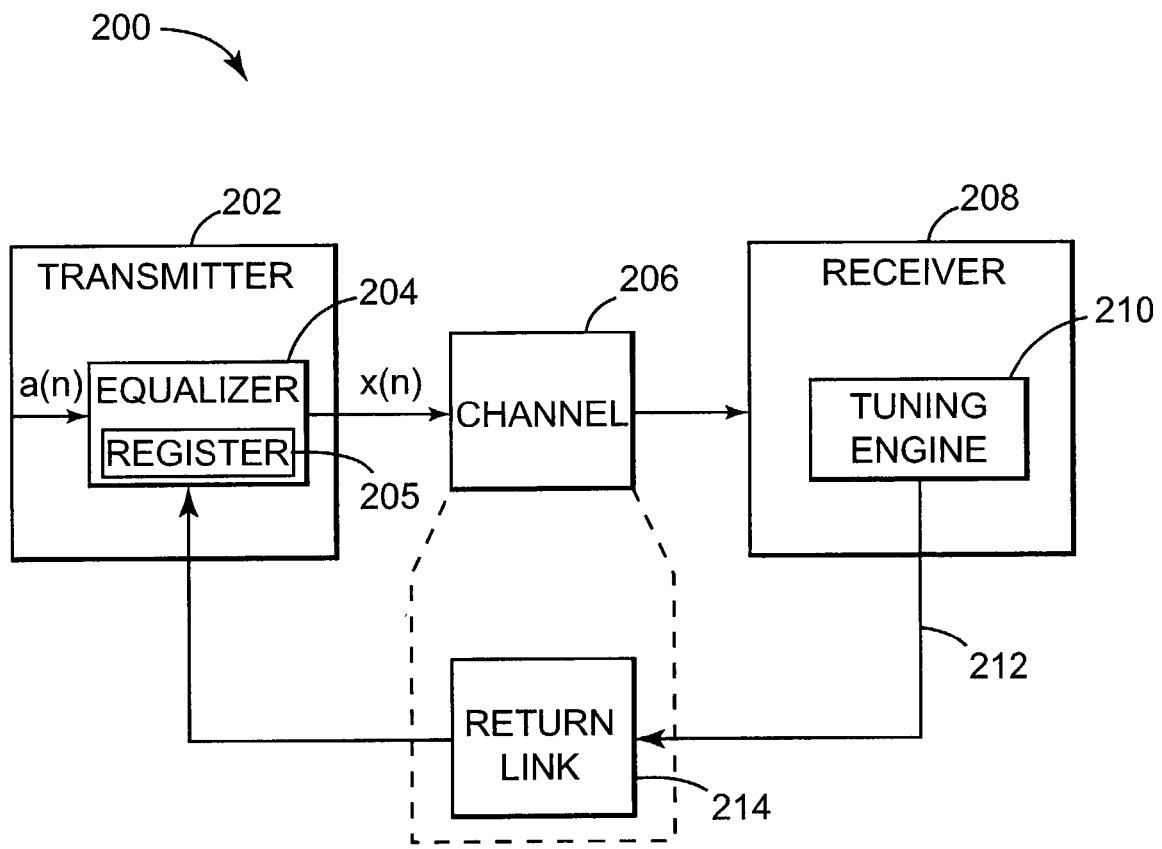
FIG. 2 is a block diagram illustrating major components of a communication system with an adaptive transmit equalizer according to one embodiment of the present invention.

FIG. 2 is a block diagram illustrating major components of a communication system 200 with an adaptive transmit equalizer 204 according to one embodiment of the present invention. System 200 includes transmitter 202, channel 206, receiver 208, and return link 214. In one embodiment, system 200 is a high-speed communication system that operates at between about 5 to 10 gigabits/second. In other embodiments, other data rates are used.

Transmitter 202 includes an adaptive transmit equalizer 204. Equalizer 204 includes storage register 205. In one embodiment, equalizer 204 is a finite impulse response (FIR) digital filter equalizer having filtering coefficients (or filter parameters or tap weights) stored in storage register 205. Equalizer 204 may be constructed in a variety of ways, including in integrated circuit form as a multiple-tap, FIR digital filter with programmable tap weights, or with a sequence of program instructions performable by a processor or digital signal processor (DSP), and/or by custom logic circuitry.

In one embodiment, data to be transmitted, a(n), is equalized prior to transmission by equalizer 204. The letter "n" in a(n) is an index value for identifying each data element. In one form of the invention, each a(n) represents a digital symbol. In one embodiment, each a(n) represents either a+1 or a−1. In other embodiments, other symbol values are used (e.g., +1, −1, +3, and −3).

The sequence of digital symbols, a(n), is equalized by equalizer 204 to produce an equalized output x(n). Equalizer 204 filters the symbols, a(n), to compensate for signal distortion that will be introduced by the communications channel 206. The equalizer 204 pre-shapes or pre-distorts the signal to be transmitted, so that when the channel 206 distorts the signal, the channel 206 essentially "fixes" the signal.

In one embodiment, the output x(n) of equalizer 204 is defined by the following Equation I:

Equation I $$x(n) = \sum_{k=0}^{L-1} w_k(n) a(n-k)$$

where:
  $w_k(n)$ is the $k^{th}$ tap weight of equalizer 204 at time n; and
  L is the length of equalizer 204 (i.e., the number of tap weights in equalizer 204).

In one embodiment, equalizer 204 uses eight tap weights (i.e., L=8). Alternative embodiments may use different numbers of tap weights. Equation I is a mathematical description of what the equalizer 204 does in one embodiment. As shown in Equation I, equalizer 204 weights the a(n)'s to generate the transmitter output x(n). In one form of the invention, the output x(n) at a given time is a weighted sum of the symbols a(n) up to that point in time. The equalized signal, x(n), is transmitted by transmitter 202 through channel 206 to receiver 208.

In one embodiment, channel 206 is a high-speed backplane channel. Primary sources of distortion for such channels include attenuation due to skin loss and dielectric loss. In another embodiment, channel 206 represents a communication path for cable modem communications. Although a couple of examples of channel types have been provided, it will be understood by persons of ordinary skill in the art that the techniques described herein are applicable to virtually any type of two-way communication system.

The signal x(n), which is transmitted by transmitter 202 over channel 206, is received by receiver 208. Receiver 208 includes a tuning engine 210. In one embodiment, received samples are used by tuning engine 210 to determine a new set of filter parameters for equalizer 204. In one form of the invention, tuning engine 210 uses a simplex algorithm 316 (shown in FIG. 4) to determine a new set of filter parameters, as described in further detail below with reference to FIG. 4.

In one embodiment, the new set of filter parameters is sent from receiver 208 back to the transmitter 202 via return link 214. The contents of the equalizer storage register 205 are updated based on the received set of new filter parameters. In this manner, the filter coefficients of the equalizer 204 are automatically adjusted by tuning engine 210 to optimize the transmitted signal for minimum intersymbol interference.

In one embodiment, return link 214 is part of channel 206 as indicated by the dotted lines in FIG. 2. In another embodiment, return link 214 is a separate line coming back from the receiver 208 to the transmitter 202. In yet another embodiment, return link 214 is a single separate line that is shared among many pairs of transmitters and receivers, such as transmitter 202 and receiver 208. In one form of the invention, tuning engine 210 transmits equalizer parameter update information to transmitter 202 over return link 214 at a relatively low rate. In one embodiment, approximately 50 to 100 kilo-samples (kS) per second are transmitted over return link 214. At 8 bits per sample and a 25% coding overhead, the baud rate per tap coefficient $w_k$ on the return link 214 in this embodiment would be between 500 and 1000 kbaud (e.g., 50kS/s*8 bit/S*1.25 baud/bit=500 kbaud).

The low rate transmission helps to ensure that the parameter update information will be received accurately at transmitter 202. In one embodiment, the parameter update information is embedded in other data being sent from receiver 208 to transmitter 202. Other embodiments may use higher rates of transmission for returning parameter update information to transmitter 202.

Figure 3:
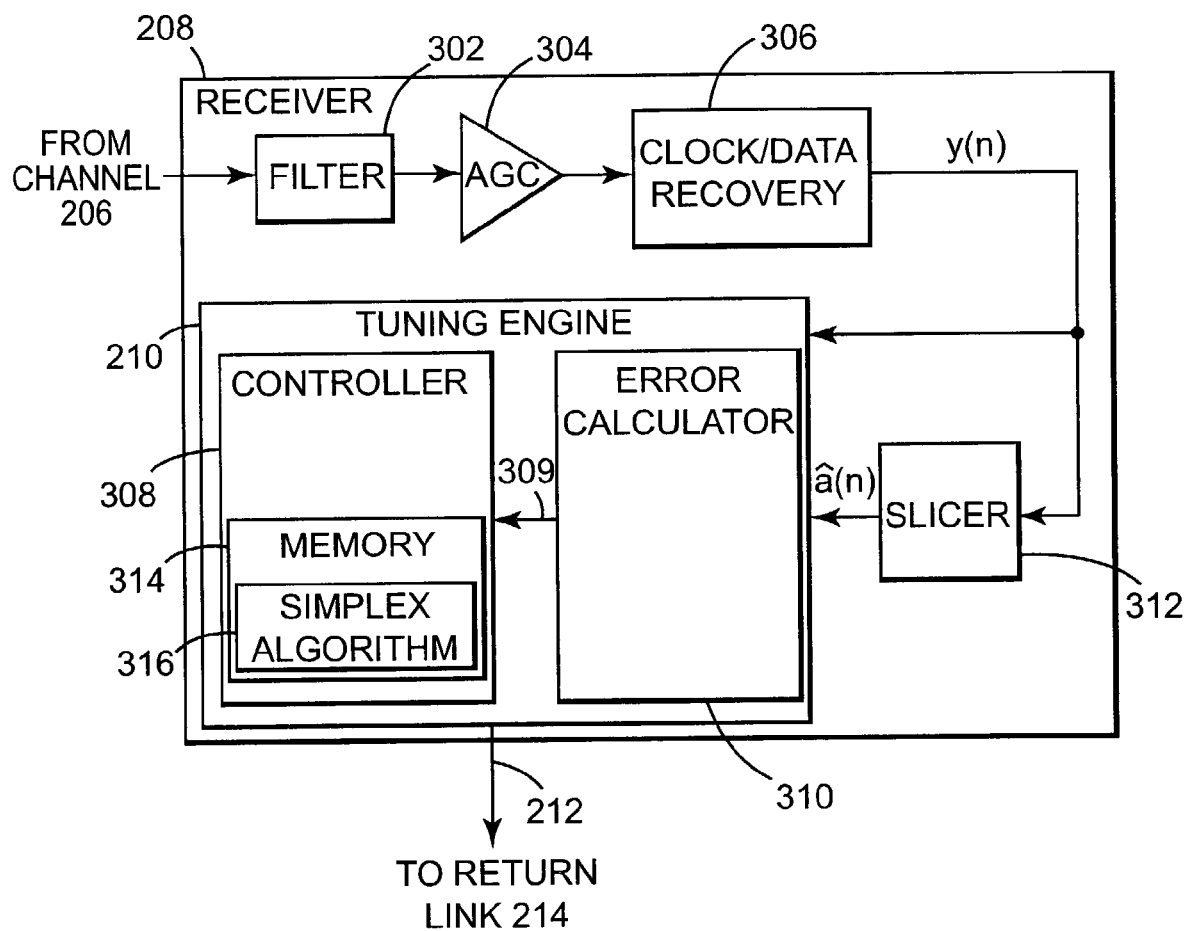
FIG. 3 is a block diagram illustrating major components of the receiver shown in FIG. 2 according to one embodiment of the present invention.

FIG. 3 is a block diagram illustrating major components of the receiver 208 shown in FIG. 2 according to one embodiment of the present invention. Receiver 208 includes filter 302, automatic gain control (AGC) 304, clock/data recover block 306, tuning engine 210, and slicer 312.

Filter 302, AGC 304, and clock/data recovery block 306, are used to Recover y(n), which are samples corresponding to the transmitted symbols a(n). In one embodiment, filter 302 is a low-pass filter for filtering out noise in the received signal. AGC 304 adjusts the gain of the signal output by filter 302. In one embodiment, AGC 304 senses the power in the signal received from filter 302, and if the power is below a given threshold, AGC 304 increases the power of the signal. If the power is above a given threshold, AGC 304 decreases the power of the signal. AGC 304 outputs a gain-adjusted signal to clock/data recover block 306. Clock/data recovery block 306 includes circuitry to recover a clock signal from the signals received from AGC 304, relative to a receiver clock (not shown) in a conventional manner known to those of ordinary skill in the art. Clock/data recovery block 306 outputs digital samples, y(n), of the received signal.

Slicer 312 is a decision device that receives a sequence of samples y(n) from clock/data recovery block 306 and, based on a conventional slicing algorithm, determines and outputs a corresponding sequence of symbols â(n) to tuning engine 210. As mentioned above, in one embodiment, the signals a(n) to be transmitted are binary signals represented by +1 or −1. However, each value for y(n) may not be exactly +1 or −1. For example, values for y(n) might be 0.8, 1.1, −0.9, etc. For each received y(n), slicer 312 makes a decision on what the original symbol a(n) was, and outputs that ideal symbol value (e.g., +1 or −1 in one embodiment), which is represented by â(n).

The output y(n) of clock/data recover block 306 and the output â(n) of slicer 312 are provided to tuning engine 210. In one embodiment, tuning engine 210 includes a controller 308 and an error calculator 310. In one embodiment, tuning engine 210 is implemented with a microprocessor and software appropriate for directing the microprocessor to perform the tuning functions described herein.

In one embodiment, based on the received y(n)'s and â(n)'s, error calculator 310 calculates a mean square error (MSE) 309 (also referred to as performance metric 309), as shown in the following Equation II:

$$MSE = [y(n) - \hat{a}(n)]^2 \qquad \text{Equation II}$$

MSE 309 is the performance metric that drives simplex algorithm 316 according to one embodiment. In one form of the invention, MSE 309 is estimated by averaging $[y(n)-\hat{a}(n)]^2$ over several samples of y(n) and â(n). In an ideal optimized system, the input y(n) and the output â(n) of slicer 312 are substantially equal and, consequently, the MSE 309 would be zero.

Based on the MSE 309 calculated by error calculator 310, controller 308 adaptively adjusts operational characteristics of equalizer 204 to optimize the performance of system 200. In one embodiment, controller 308 determines new filter parameters $W_k$ for the equalizer 204 using simplex algorithm 316 stored in memory 314 of controller 308.

After calculating updated filter coefficients, these updated filter coefficients are transmitted to the transmitter 202 via return link 214 and loaded into the register 205 of equalizer 204. In one form of the invention, controller 308 continually adjusts the filter coefficients of the equalizer 204 in accordance with the MSE 309 supplied by the error calculator 310. In one embodiment, once the MSE 309 converges to an acceptable value, equalizer 204 is considered to be adequately trained. In an alternative embodiment, controller 308 periodically or continuously provides updated filter coefficients to equalizer 204 to adjust for changing channel conditions.

Figure 4:
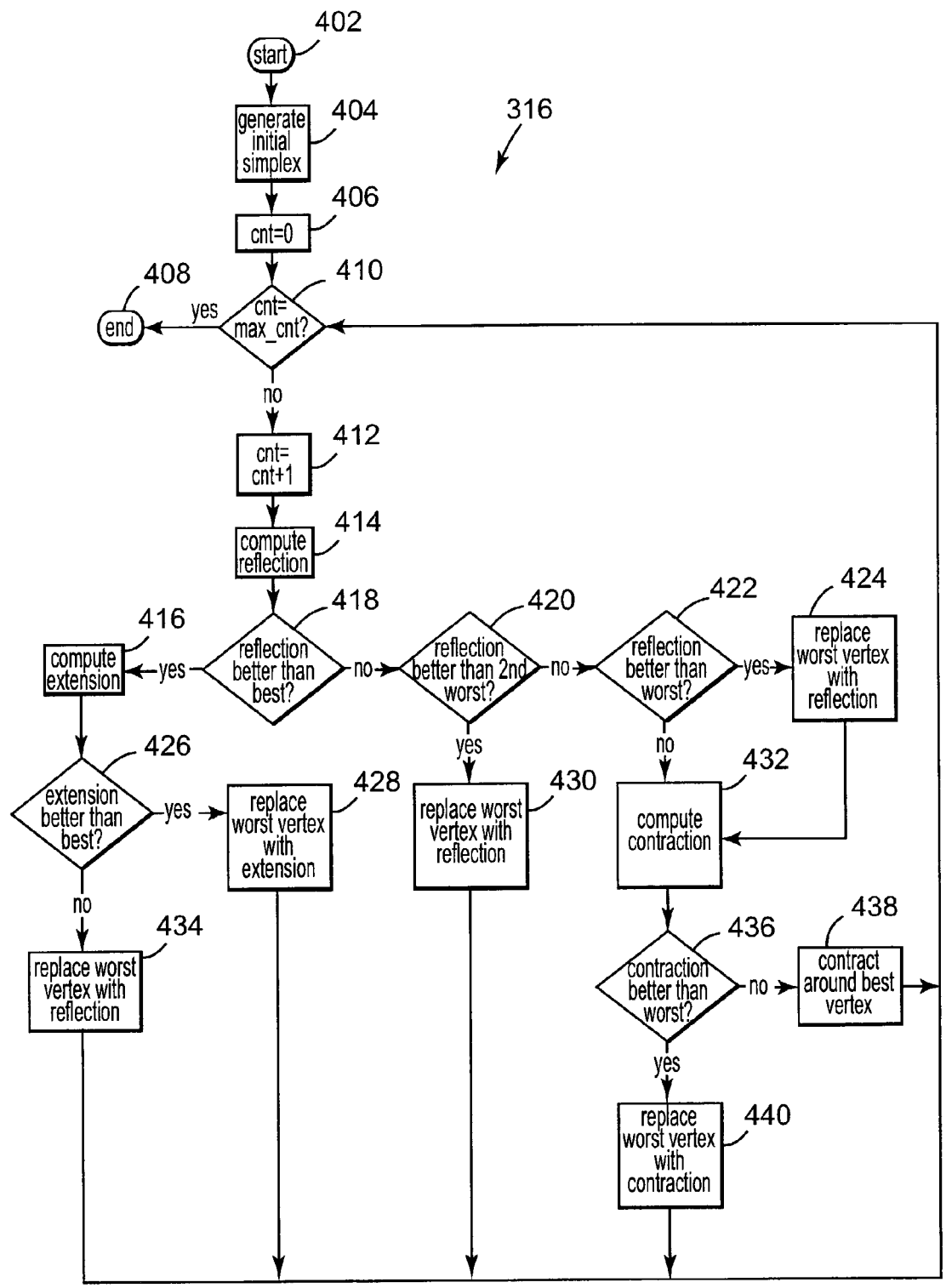
FIG. 4 is a flow diagram of a simplex algorithm for updating filter coefficients for an equalizer according to one embodiment of the present invention.

FIG. 4 is a flow diagram of a simplex algorithm 316 for updating filter coefficients of equalizer 204 according to one embodiment of the present invention. Algorithm 316 will also be described with reference to FIGS. 5A-5E, which are diagrams illustrating example simplex structures, and reflection, extension, and contraction operations, according to one embodiment of the present invention. In one form of the invention, simplex algorithm is performed by controller 308 (shown in FIG. 3).

In one embodiment, simplex algorithm 316 does not use derivatives, but rather uses a "simplex" to find reasonable directions when searching a performance surface. A "simplex," according to one form of the invention, is a geometric object with straight edges connecting a finite number of vertices (points in N space) and is defined in an N-dimensional space (for example, in 2 dimensions, it would be a polygon, like a square, and in 3 dimensions it might be a cube, etc.). Simplex methods are discussed in J. A. Nelder and R. Mead, A Simplex Method for Function Minimization, Computer Journal, v. 7, p. 308, 1965, and W. H. Press, B. P. Flannery, S. A. Teukolsky and W. T. Vetterling, Numerical Recipes, Cambridge, 1986, which are hereby incorporated by reference herein.

Figure 5A:
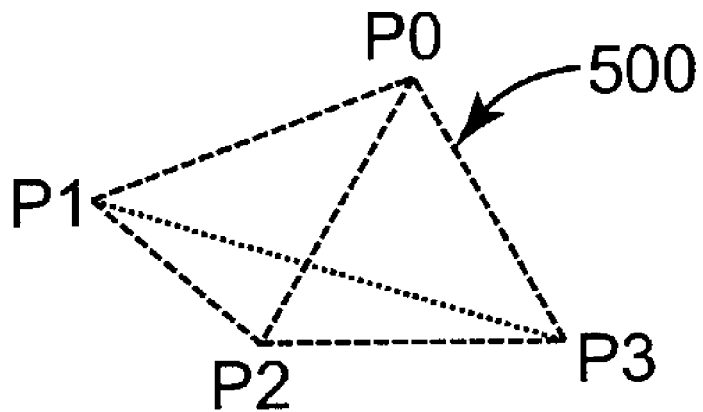
FIGS. 5A-5E are diagrams illustrating example simplex structures, and reflection, extension, and contraction operations, according to one embodiment of the present invention.

The simplex algorithm 316 starts at step 402 as shown in FIG. 4. In step 404, controller 308 generates an initial simplex. FIG. 5A is a diagram illustrating an example initial simplex 500. Simplex 500 includes four vertices P0-P3, with straight edges connecting the vertices.

During step 404, controller 308 associates each vertex in the initial simplex 500 with a set of trial filter parameters that define the position of the vertex in N-space. Given an initial set of parameters or a parameter vector, P0={p0(1), p0(2), ..., p0(N)}, the initial simplex includes N+1 vertices, P0, P1, P2, ..., PN. In one embodiment, each of the vertices P1-PN is generated from vertex P0 by varying (e.g., randomly) one of the parameters of P0. For example, P1={p1(1), p1(2), ..., p1(N)}, where p1(1)=p0(1)+delta, p1(2)=p0(2), ..., p1(N)=p0(N)}; P2={p2(1), p2(2), ..., p2(N)}, where p2(1)=p0(1), P2(2)=p0(2)+delta, ..., p2(N)=p0(N)}; etc. In one embodiment, delta is randomly chosen for each vertex.

Steps 410-440 are a repeating loop for iteratively searching the performance surface for the best set of parameters. The variable "cnt" tracks the number of iterations and the variable "max_cnt" specifies the maximum number of iterations. In step 406, cnt is initialized by being set to zero. Step 410 is a decision block for determining whether cnt=max_cnt. If cnt=max_cnt, the algorithm ends, as shown in step 408. If cnt≠max_cnt, the algorithm moves to step 412. In step 412, cnt is incremented by one. In one form of the invention, at each iteration of the repeating loop, a new simplex is generated by replacing the worst vertex in the current simplex with at least one better vertex as described below.

In step 414, a "reflection" is computed. In one embodiment, a reflection is computed by controller 308 using the following Equation III:

$$P_R = (1+\alpha)C - \alpha P_W \qquad \text{Equation III}$$

where:
- $P_R$ is the reflection vertex;
- $\alpha$ is a reflection coefficient, which is a positive constant in one embodiment;
- $P_W$ is the "worst" vertex in the current simplex; and
- C is the centroid of the current simplex excluding $P_W$.

In one form of the invention, the "worst" vertex in the simplex is determined by ranking all of the vertices based on performance metric values. Each vertex in the simplex is associated with a performance metric value. In one embodiment, the performance metric value for each vertex is determined during an initialization phase by first setting the filter coefficients of equalizer 204 to values corresponding to the first vertex, and determining the MSE 309. The filter coefficients of equalizer 204 are then set to values corresponding to the second vertex, and the MSE 309 is determined. This process is repeated for each vertex in the simplex. The performance metric value for each vertex is stored in memory 314 once it has been determined.

Figure 5B:
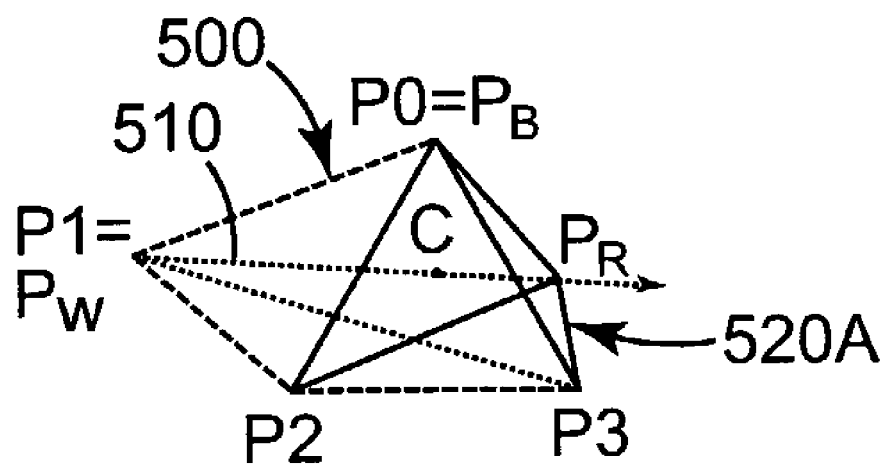

Based on the stored performance metric values for the vertices, the vertices are ranked from worst (worst performance) to best (best performance). In Equation III, the worst vertex is represented by $P_W$. Using Equation III, controller 308 determines a possible new vertex that might replace $P_W$, which is referred to as the reflection, $P_R$, where $P_R = \{pr(1), \ldots, pr(N)\}$. FIG. 5B is a diagram illustrating the example initial simplex 500 shown in FIG. 5A, with a reflection vertex, $P_R$. The initial simplex 500 is illustrated with broken lines in FIG. 5B. As shown in FIG. 5B, vertex P1 has been identified as the worst vertex $P_W$, and vertex P0 has been identified as the best vertex $P_B$. A line 510 has been drawn from the worst vertex P1 through the centroid, C, of the simplex that excludes the worst vertex (i.e., the simplex formed by vertices P0, P2, and P3). Since the worst vertex $P_W$ in the current simplex is known, controller 308 "looks" for a reflection vertex $P_R$ in the "opposite direction" from the worst vertex $P_W$. As shown in FIG. 5B, the "opposite direction" from the worst vertex $P_W$ is the direction defined by the line 510 from the worst vertex $P_W$ through the centroid C of the simplex without the worst vertex.

The position of the reflection vertex $P_R$ (e.g., before, at, or after the centroid C of the simplex along line 510) depends on the value of $\alpha$ in Equation III. In one embodiment, $\alpha$ is chosen so that the reflection vertex $P_R$ is on the far side of the centroid C away from the worst vertex $P_W$ as shown in FIG. 5B.

The set of parameters (i.e., parameter vector) for the new vertex, Pr, is determined using Equation III. Equation III uses the centroid C, where C=[c(1), c(2), . . . , c(N)]. In one embodiment, the centroid C is computed by averaging the parameter vectors for all of the vertices in the simplex except the worst vertex (i.e., c(1)=(p0(1)+p1(1)+p2(1), . . . , +pN(1))/N, c(2)=(p0(2)+p1(2)+p2(2), . . . , +pN(2))/N, etc., where the parameters for the worst vertex $P_W$ are excluded from the calculation of c(1), c(2), . . . , c(N)).

After the reflection $P_R$ is calculated in step 414, controller 308 determines in step 418 whether the reflection $P_R$ is better than the best vertex $P_B$. In one embodiment, this determination is made by first setting the filter coefficients of equalizer 204 to the values corresponding to the parameters of the reflection vertex $P_R$, and determining the performance metric value (e.g., MSE 309). This performance metric value for $P_R$ is stored in memory 314, and is compared to the performance metric value for the best vertex $P_B$. If the performance metric value for $P_R$ is better than the performance metric value for $P_B$, controller 308 moves to step 416. If the performance metric value for $P_R$ is not better than the performance metric value for $P_B$, controller 308 moves to step 420.

In step 416, an "extension" is computed. In one embodiment, an extension is computed by controller 308 using the following Equation IV:

$$P_E = \gamma P_R + (1-\gamma)C \qquad \text{Equation IV}$$

where:
- $P_E$ is the extension vertex;
- $\gamma$ is an extension coefficient, which is a positive constant greater than unity in one embodiment;
- $P_R$ is the reflection vertex calculated from Equation III; and
- C is the centroid of the current simplex excluding $P_W$.

Figure 5C:
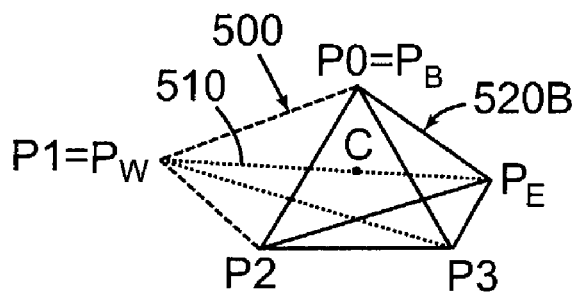

FIG. 5C is a diagram illustrating the example initial simplex 500 shown in FIG. 5A, with an extension vertex, $P_E$. The initial simplex 500 is illustrated with broken lines in FIG. 5C. As shown in FIG. 5C, a line 510 has been drawn from the worst vertex P1 through the centroid, C, of the simplex that excludes the worst vertex (i.e., the simplex formed by vertices P0, P2, and P3). $P_E$ is called an extension because it is in the same direction as the line 510 going from the worst vertex P1 to the reflection vertex $P_R$ (shown in FIG. 5B), only it extends farther than the reflection. A rationale for the extension is that if going from the worst vertex P1 to $P_R$ is good, then going from the worst vertex P1 to $P_E$ might be even better.

In step 426, controller 308 determines whether the extension $P_E$ is better than the best vertex $P_B$. In one embodiment, this determination is made by first setting the filter coefficients of equalizer 204 to the values corresponding to the parameters of the extension vertex $P_E$, and determining the performance metric value (e.g., MSE 309). This performance metric value for $P_E$ is stored in memory 314, and is compared to the performance metric value for the best vertex $P_B$. If the performance metric value for $P_E$ is not better than the performance metric value for $P_B$, controller 308 moves to step 434. In step 434, the worst vertex $P_W$ is replaced by the reflection vertex $P_R$ to generate a new simplex. As shown in FIG. 5B, the worst vertex (i.e., P1) in the initial simplex 500 is replaced by the reflection vertex $P_R$ to generate a new simplex 520A, which includes vertices P0, P2, P3, and $P_R$. After step 434, algorithm 316 jumps to decision block 410.

If it is determined in step 426 that the performance metric value for $P_E$ is better than the performance metric value for $P_B$, controller 308 moves to step 428. In step 428, the worst vertex $P_W$ is replaced by the extension vertex $P_E$ to generate a new simplex. As shown in FIG. 5C, the worst vertex (i.e., P1) in the initial simplex 500 is replaced by the extension vertex $P_E$ to generate a new simplex 520B, which includes vertices P0, P2, P3, and $P_E$. After step 428, algorithm 316 jumps to decision block 410.

Referring back to step 418, if it is determined in this step that the reflection $P_R$ is not better than the best vertex $P_B$ (i.e., the performance metric value for $P_R$ is not better than the performance metric value for $P_B$), controller 308 moves to step 420, and determines whether the reflection $P_R$ is better than the second worst vertex. If the reflection $P_R$ is better than the second worst vertex, in step 430, controller 308 replaces the worst vertex $P_W$ with the reflection vertex $P_R$ to generate a new simplex (e.g., simplex 520A shown in FIG. 5B). After step 430, algorithm 316 jumps to decision block 410.

If it is determined in step 420 that the reflection $P_R$ is not better than the second worst vertex, in step 422, controller 308 determines whether the reflection $P_R$ is better than the worst vertex $P_W$. If it is determined in step 422 that the reflection $P_R$ is not better than the worst vertex $P_W$, controller 308 moves to step 432. If it is determined in step 422 that the reflection $P_R$ is better than the worst vertex $P_W$, in step 424, controller 308 replaces the worst vertex $P_W$ with the reflection vertex $P_R$ to generate a new simplex (e.g., simplex 520A shown in FIG. 5B), and moves to step 432.

Figure 5D:
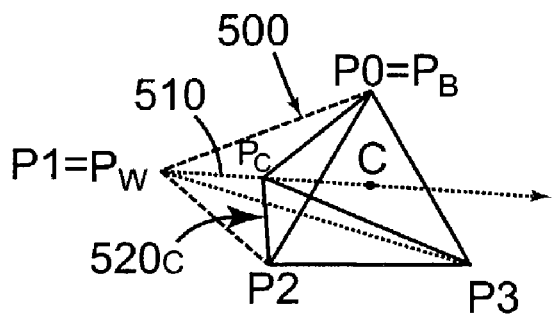

In step 432, a "contraction" is computed. In one embodiment, a contraction is computed by controller 308 using the following Equation V:

$$P_C = \beta P_W (1-\beta) C \qquad \text{Equation V}$$

where:
  $P_C$ is the contraction vertex;
  $\beta$ is a contraction coefficient, which is a constant between 0 and 1 in one embodiment;
  $P_W$ is the worst vertex in the current simplex; and
  C is the centroid of the current simplex excluding $P_W$ FIG. 5D is a diagram illustrating the example initial simplex 500 shown in FIG. 5A, with a contraction vertex, $P_C$. The initial simplex 500 is illustrated with broken lines in FIG. 5D. As shown in FIG. 5D, a line 510 has been drawn from the worst vertex P1 through the centroid, C, of the simplex that excludes the worst vertex (i.e., the simplex formed by vertices P0, P2, and P3). $P_C$ is called a contraction because it is in the same direction as the line 510 going from the worst vertex P1 to the reflection vertex $P_R$, only it does not extend as far as the reflection. A rationale for the contraction is that if going from the worst vertex P1 to $P_R$ is good (e.g., because it is in the opposite direction from the worst vertex P1), then maybe going all the way to $P_R$ may be too far, and stopping at $P_C$ may be better.

In step 436, controller 308 determines whether the contraction vertex $P_C$ is better than the worst vertex $P_W$. In one embodiment, this determination is made by first setting the filter coefficients of equalizer 204 to the values corresponding to the parameters of the contraction vertex $P_C$, and determining the performance metric value (e.g., MSE 309). This performance metric value for $P_C$ is stored in memory 314, and is compared to the performance metric value for the worst vertex $P_W$. If the performance metric value for $P_C$ is better than the performance metric value for $P_W$, controller 308 moves to step 440. In step 440, the worst vertex $P_W$ is replaced by the contraction vertex $P_C$ to generate a new simplex. As shown in FIG. 5D, the worst vertex (i.e., P1) in the initial simplex 500 is replaced by the contraction vertex $P_C$ to generate a new simplex 520C, which includes vertices P0, P2, P3, and $P_C$. After step 440, algorithm 316 jumps to decision block 410.

If it is determined in step 436 that the performance metric value for $P_C$ is not better than the performance metric value for $P_W$, controller 308 moves to step 438. In step 438, the current simplex is contracted around the best vertex $P_B$. In one embodiment, contraction around the best vertex $P_B$ is computed by controller 308 using the following Equation VI:

$$Pk' = (Pk + P_B)/2 \qquad \text{Equation VI}$$

where:
  Pk is the kth vertex in the current simplex;
  $P_B$ is the best vertex in the current simplex; and
  Pk' is the kth vertex in the new, contracted simplex.

Figure 5E:
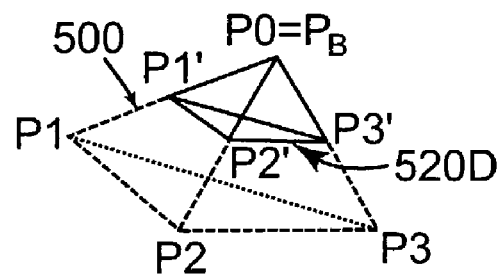

FIG. 5E is a diagram illustrating the example initial simplex 500 shown in FIG. 5A, contracted around the best vertex P0 to generate a new simplex 520D, which includes vertices P0, P1', P2', and P3'. The initial simplex 500 is illustrated with broken lines in FIG. 5E. Each of the vertices Pk in the initial simplex 500 other than the best vertex $P_B$ (e.g., vertices P1, P2, and P3) are replaced by vertices Pk' (e.g., vertices P1', P2', and P3'), which are closer to the best vertex $P_B$. As can be seen from Equation VI, each vertex Pk' is generated in one embodiment by adding the best vertex $P_B$ to the vertex Pk from the initial simplex 500, and dividing the result by two. A rationale for contracting the simplex about the best vertex is that the best vertex might be near an optimum, or the simplex might have to be contracted to get through a keyhole in an N-dimensional performance surface.

In one embodiment, the performance metric values for each of the new vertices Pk' in the new simplex 520D are determined by setting the filter coefficients of equalizer 204 to the values corresponding to the parameter vectors of each of these vertices and determining the MSE 309. After step 438, algorithm 316 jumps to decision block 410.

In step 410, if controller 308 determines that cnt=max_cnt, the algorithm 316 ends, as shown in step 408, and the filter parameters from best vertex $P_B$ are transmitted by the tuning engine 210 over the return link 214 to the equalizer 204, which updates the parameters stored in the register 205 accordingly.

To help ensure that algorithm 316 has found the global optimum (if one exists), the algorithm 316 may be restarted using the best filter parameters found so far as the initial guess. If the parameters truly are the best, the algorithm 316 should again converge to the same settings. However, if the initial results only identified a local optimum, restarting the algorithm 316 may result in a better, perhaps global, optimum being found. In one embodiment, algorithm 316 is used for "on-line" adaptation. That is, after initial training, tuning engine 210 continues to use algorithm 316 to adjust to changing channel conditions.

Performance metrics other than (or in addition to) the mean square error of y(n) and â(n) may be used to drive simplex algorithm 316. For example, if the transmitted data a(n) is known by receiver 208 (e.g., such as a known training sequence), the mean square error performance metric 309 could be computed using a(n) instead of â(n).

As another example, by knowing y(n), and â(n) or a(n), the performance metric 309 could be vertical eye opening. In this case, the performance metric 309 could be generated by estimating the eye opening using y(n). For instance, with binary signaling, the nominal values for a(n) are +1/−1. Thus, the worst case eye opening could be estimated by min{yp(n)}− max {yn(n)} where yp(n)=y(n) whenever a(n) (or â(n)) is +1 and yn(n)=y(n) whenever a(n) (or â(n)) is −1. The vertical eye opening case for multi-level symbols is similar to the above-described binary symbol case.

The performance metric 309 could also be clock jitter. A clock jitter performance metric can be generated using a circuit that measures the variance of the clock jitter. In one embodiment, this measuring circuit would be a part of the clock/data recovery block 306.

The performance metric 309 could also be a weighted combination of individual performance metrics, such as mean square error (or vertical eye opening) and clock jitter.

An advantage of one form of the present invention is that the tuning engine 210 is based on a simplex algorithm rather than the commonly used LMS algorithm. For the LMS algorithm, one of the inputs to the algorithm is the unequalized channel output samples. This means that, to implement an adaptive transmit equalizer with the LMS algorithm, there must either be a copy of the equalizer in the receiver, or there must be a means to reconstruct the unequalized channel output samples. Although this can be done, it is not practical given the receiver constraints and expected data rates. This issue is avoided with one embodiment of the present invention, which uses a simplex algorithm.

In addition, the LMS algorithm is based solely on mean square error as the performance metric, whereas one form of the present invention is easily modified to use other performance metrics (e.g., minimizing a combination of mean square error and clock jitter).

As described above in the Background of the Invention section, currently used algorithms for adaptively training a receiver equalizer include LMS, RLS, and CMA algorithms. None of these techniques can accept as general a criteria for goodness (e.g., performance metrics) as the simplex algorithm used in one embodiment of the present invention.

Further, one embodiment of the present invention provides an adaptive equalizer in the transmitter, which has advantages over approaches that implement the equalizer in the receiver. For example, since the equalizer is implemented in the transmitter in one embodiment, the problem of noise enhancement associated with receiver equalization is avoided.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An adaptive transmit equalizer of a transmitter for equalizing digital symbols to be transmitted by the transmitter over a communications channel to a receiver, the equalizer comprising:
a transmit filter having an associated register for storing at least one filter coefficient, said at least one filter coefficient stored in the register being received in the transmitter via the communications channel from a tuning engine of the receiver, wherein the transmit filter compensates for distortion in the communications channel, and wherein the tuning engine generates performance metric values based on digital symbols received through the communications channel from the transmitter, wherein the performance metric values include a weighted combination of individual performance metrics including vertical eye opening values and clock jitter values, the tuning engine using a simplex algorithm that identifies said at least one new filter coefficient based on the performance metric values.

2. The adaptive transmit equalizer of claim 1, wherein the transmit filter is a digital finite impulse response (FIR) filter.

3. The adaptive transmit equalizer of claim 1, wherein the performance metric values include mean square error values.

4. The adaptive transmit equalizer of claim 1, wherein the simplex algorithm determines a new vertex by averaging all but the worst of the parameter vectors for the vertices in a simplex.

5. The adaptive transmit equalizer of claim 1, wherein the tuning engine is configured to generate an initial simplex having a plurality of vertices, with each vertex in the plurality of vertices associated with a set of filter coefficients, and wherein the tuning engine is configured to iteratively generate new simplexes by replacing a vertex in a previously generated simplex with a new vertex.

6. The adaptive transmit equalizer of claim 5, wherein the tuning engine is configured to identify the at least one new filter coefficient based on the filter coefficients associated with one of the vertices in one of the generated simplexes.

7. A method of optimizing filter parameters of an equalizer for a transmitter of a communication system, the transmitter being in communication with a receiver via a communications channel, the method comprising:
in the receiver, generating a first simplex having N vertices, each vertex in the N vertices associated with a set of filter parameters;
in the receiver, identifying a new vertex for the first simplex, the new vertex associated with a set of filter parameters;
in the receiver, generating a second simplex by replacing one of the N vertices with the new vertex;
in the receiver, identifying a best vertex in the second simplex based on performance values associated with each vertex, wherein the performance values include a weighted combination of individual performance metrics including vertical eye opening values and clock jitter values;
in the transmitter, updating the filter parameters of the equalizer based on the filter parameters associated with the best vertex; and
in the transmitter, equalizing a signal to be transmitted over the communications channel from the transmitter to the receiver based on the updated filter parameters to compensate for distortion in the communications channel.

8. The method of claim 7, wherein the step of identifying a new vertex for the first simplex comprises:
identifying a worst vertex in the first simplex based on the performance value associated with each vertex; and
identifying a point that lies along a line connecting the worst vertex and a centroid of the first simplex excluding the worst vertex, wherein the identified point is the new vertex.

9. The method of claim 7, and further comprising:
associating a performance value with each vertex by setting the filter parameters of the equalizer to the filter parameters associated with the vertex and calculating the performance value based on data output from the equalizer.

10. The method of claim 7, wherein the performance value associated with each vertex is at least one of mean square error, clock jitter, and vertical eye opening.

11. The method of claim 7, wherein the equalizer includes a digital finite impulse response (FIR) filter.

12. An apparatus for updating filter parameters of an equalizer in a communication system, the equalizer being part of a transmitter that is in communication with a receiver via a communications channel, the apparatus comprising:
means in the receiver for generating an initial simplex having a plurality of vertices, with each vertex in the plurality of vertices associated with a set of filter parameters;
means in the receiver for iteratively generating new simplexes by replacing a vertex in a previously generated simplex with a new vertex, each new vertex associated with a set of filter parameters;
means in the receiver for determining a performance metric value for each vertex in each generated simplex;
means in the receiver for identifying a best vertex in one of the generated simplexes based on the performance metric values associated with the vertices in that simplex, wherein the performance values include a weighted combination of individual performance metrics including vertical eye opening values and clock jitter values;

means in the receiver for causing the set of filter parameters associated with the identified best vertex to be communicated from the receiver to the transmitter via the communications channel;

means in the transmitter for updating the filter parameters of the equalizer based on the filter parameters associated with the best vertex; and means in the transmitter for equalizing a signal to be transmitted over the communications channel from the transmitter to the receiver based on the updated filter parameters to compensate for distortion in the communications channel.

13. The apparatus of claim 12, wherein the means in the receiver for iteratively generating new simplexes comprises:

means for identifying a worst vertex in a previously generated simplex based on the performance metric value associated with each vertex in that simplex; and means for identifying a point that lies along a line connecting the worst vertex and a centroid of the previously generated simplex excluding the worst vertex, wherein the identified point is in the new vertex.

14. The apparatus of claim 12, wherein the means in the receiver for determining a performance metric value comprises:

means for setting the filter parameters of the equalizer to the filter parameters associated with a vertex; and means for calculating the performance metric value for the vertex based on data output from the equalizer.

15. The apparatus of claim 12, wherein the performance metric value associated with each vertex is at least one of mean square error, clock jitter, and vertical eye opening.

16. The apparatus of claim 12, wherein the equalizer comprises a digital finite impulse response (FIR) filter.

17. A communication system having a communications channel for communicating between a transmitter and a receiver of the communications system, the communications system comprising:

a transmitter for transmitting a sequence of digital symbols, the transmitter including an equalizer for filtering the sequence of digital symbols prior to transmission to compensate for distortion in the communications channel;

a receiver for receiving the filtered sequence of digital symbols via the communications channel, the receiver including a tuner for performing a simplex algorithm to generate equalizer tuning information, the simplex algorithm identifying a best vertex in a generated simplex based on the performance metric values associated with the vertices in that simplex, wherein the performance values include a weighted combination of individual performance metrics including vertical eye opening values and clock jitter values; and a return communications link coupling the transmitter and the receiver for carrying the equalizer tuning information from the receiver to the transmitter.

18. The communication system of claim 17, wherein the equalizer comprises a digital finite impulse response (FIR) filter.

19. The communication system of claim 17, wherein the tuner is configured to generate performance metric values based on received digital symbols, and generate the equalizer tuning information based on the performance metric values using the simplex algorithm.

20. The communication system of claim 19, wherein the performance metric values are selected from the group consisting of: mean square error values, clock jitter values, and vertical eye opening values.

21. The communication system of claim 17, wherein the tuner is configured to generate an initial simplex having a plurality of vertices, with each vertex in the plurality of vertices associated with a set of filter parameters, and iteratively generate new simplexes by replacing a vertex in a previously generated simplex with a new vertex, with each new vertex associated with a set of filter parameters.

22. The communication system of claim 21, wherein the tuner is configured to determine a performance metric value for each vertex in each generated simplex, and identify a best vertex in one of the generated simplexes based on the performance metric values associated with the vertices in that simplex.

23. The communication system of claim 22, wherein the tuner is configured to generate the equalizer tuning information based on the filter parameters associated with the best vertex.

24. The communication system of claim 17, wherein the receiver transmits data to the transmitter over the return communications link at a low transmission rate.

25. The communication system of claim 17, wherein the receiver transmits data to the transmitter over the return communications link at a rate of between about 500 kbaud and 1000 kbaud.

* * * * *